US012602215B1

(12) United States Patent
Shukla et al.

(10) Patent No.:     US 12,602,215 B1
(45) Date of Patent:         Apr. 14, 2026

(54) CLOUD ENABLED HARDWARE SIMULATION WITH SMART REUSE OF HISTORICAL DATA

(71) Applicant: Synopsys, Inc., Mountain View, CA (US)

(72) Inventors: Shobhit Shukla, Noida (IN); Amit Kumar, Noida (IN); Mayank Gupta, Mountain View, CA (US)

(73) Assignee: Synopsys, Inc., Sunnyvale, CA (US)

( * ) Notice: Subject to any disclaimer, the term of this patent is extended or adjusted under 35 U.S.C. 154(b) by 612 days.

(21) Appl. No.: 18/098,597

(22) Filed: Jan. 18, 2023

(51) Int. Cl.
*G06F 8/41*          (2018.01)
*G06F 8/36*          (2018.01)
*G06F 30/33*       (2020.01)

(52) U.S. Cl.
CPC .................. *G06F 8/48* (2013.01); *G06F 8/36* (2013.01); *G06F 8/41* (2013.01); *G06F 30/33* (2020.01)

(58) Field of Classification Search
None
See application file for complete search history.

(56)                    References Cited

U.S. PATENT DOCUMENTS

| 10,794,954 B1 * | 10/2020 | Chang ..................... G06F 30/33 |
| 2021/0218800 A1 * | 7/2021 | Landman .............. H04L 9/3239 |

OTHER PUBLICATIONS

"Synopsys Datasheet", Synopsys.com, Oct. 26, 2021. (Year: 2021).*

* cited by examiner

*Primary Examiner* — Qing Yuan Wu
(74) *Attorney, Agent, or Firm* — Lowenstein Sandler LLP

(57)                    ABSTRACT

A method includes receiving, by a processing device, receiving a data file, dividing the data file into a plurality of partitions based on a defined criteria, compiling the plurality of partitions associated with the data file to form a plurality of compiled partitions, generating a status identifier for each of the plurality of partitions, wherein the status identifier reflects a current version of a corresponding partition. The method further includes combining the plurality of compiled partitions to form a first executable file, and storing the plurality of compiled partitions and a corresponding status identifier for each of the plurality of compiled partitions in a first storage area of a first storage medium. The method also includes receiving a request for the data file, identifying that one or more partitions of the plurality of partitions is reusable, and sending the one or more partitions identified as being reusable.

20 Claims, 6 Drawing Sheets

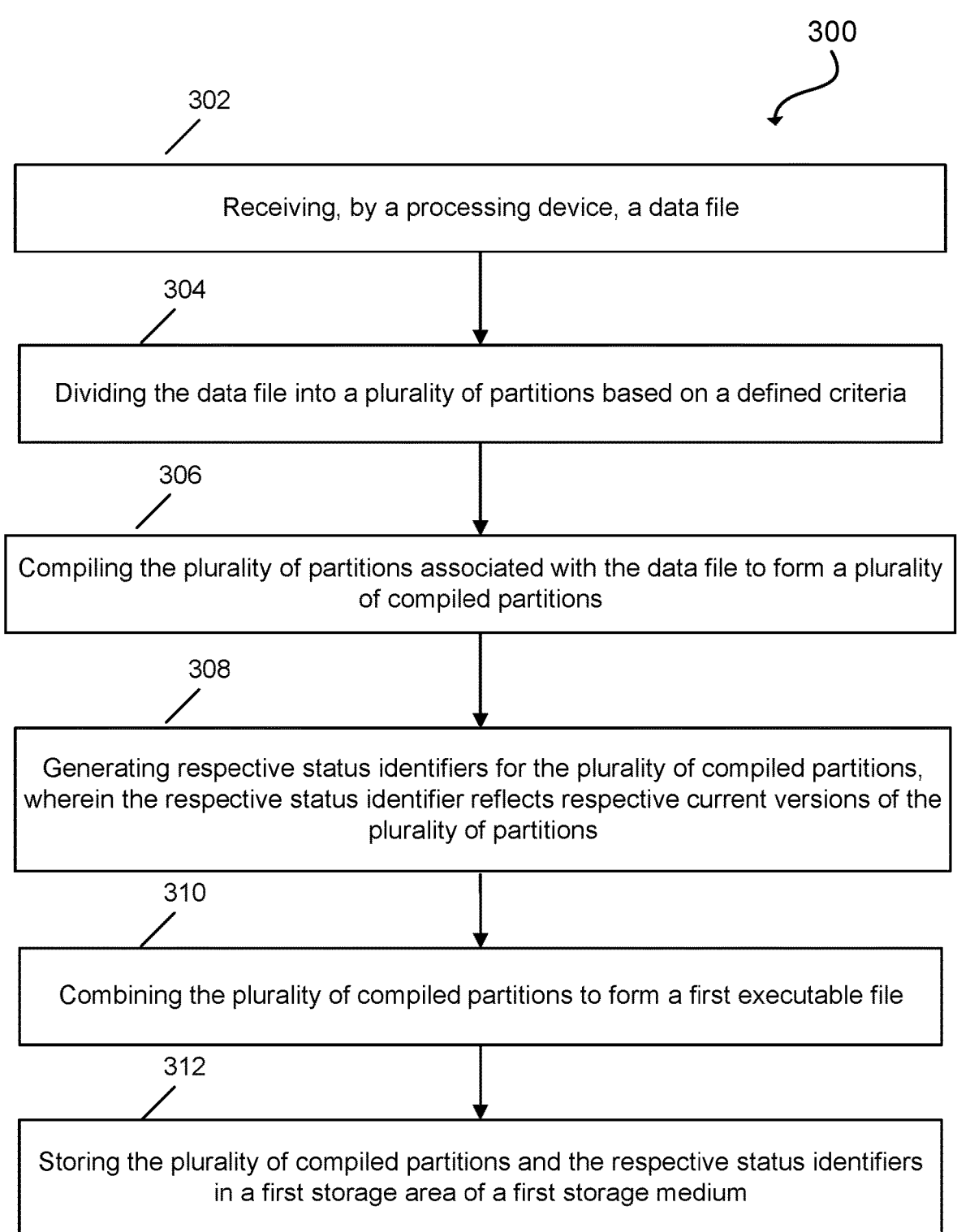

300

302

Receiving, by a processing device, a data file

304

Dividing the data file into a plurality of partitions based on a defined criteria

306

Compiling the plurality of partitions associated with the data file to form a plurality of compiled partitions

308

Generating respective status identifiers for the plurality of compiled partitions, wherein the respective status identifier reflects respective current versions of the plurality of partitions

310

Combining the plurality of compiled partitions to form a first executable file

312

Storing the plurality of compiled partitions and the respective status identifiers in a first storage area of a first storage medium

FIG. 3A

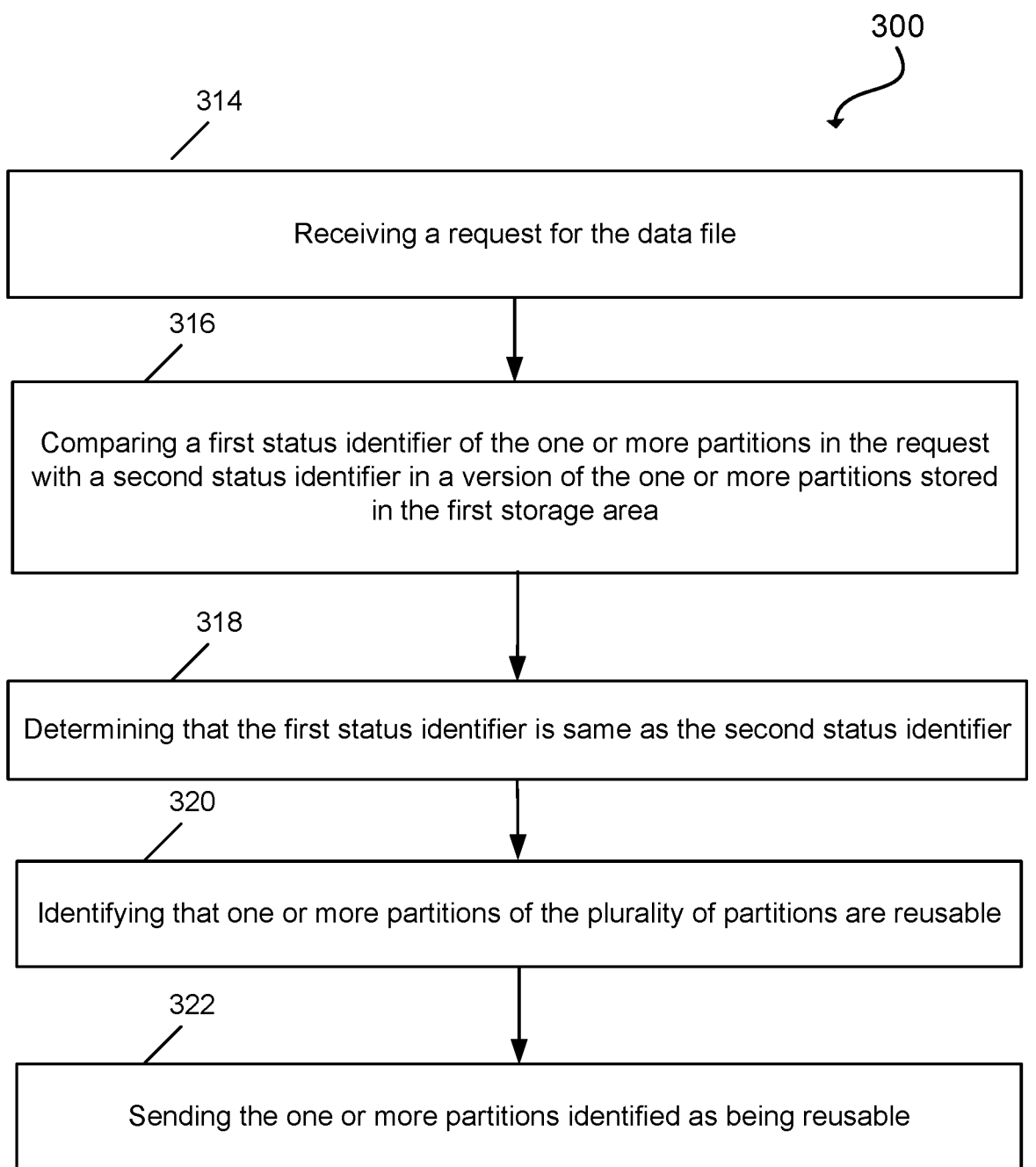

300

314

Receiving a request for the data file

316

Comparing a first status identifier of the one or more partitions in the request with a second status identifier in a version of the one or more partitions stored in the first storage area

318

Determining that the first status identifier is same as the second status identifier

320

Identifying that one or more partitions of the plurality of partitions are reusable

322

Sending the one or more partitions identified as being reusable

Product Idea 410

EDA Processes 412

Tape Out 434

Fabrication 436

Packaging & Assembly 438

Manufactured Chips 440

System Design 414

Logical Design and Functional Verification 416

Synthesis and Design for Test 418

Netlist Verification 420

Design Planning 422

Physical Implementation 424

Analysis and Extraction 426

Physical Verification 428

Resolution Enhancement 430

Mask Data Preparation 432

500

CLOUD ENABLED HARDWARE SIMULATION WITH SMART REUSE OF HISTORICAL DATA

TECHNICAL FIELD

The present disclosure relates generally to an electronic design automation (EDA) system. In particular, the present disclosure relates to cloud enabled hardware simulation systems.

BACKGROUND

Verification of a system-on-chip (SoC) is becoming increasingly complex due to the multitude of functionality being implemented on a single chip. Different verification techniques are required at each level (e.g., IP, block, SoC, and system) for faster verification closure. A successful verification strategy includes reuse of functional tests, faster test development, and faster debugging to improve the verification productivity. The Turbo-Compile flow of VCS® is one example of a process flow that attempts to share the compiled design partitions during incremental runs through shared libraries, which results in better compile time.

However, management of the shared libraries over the cloud occurs outside of the tool (e.g., VCS®) using user's own toolchains, and users are still using the traditional network file system (NFS) to manage their files. Network File System (NFS) is a distributed file system protocol that allows a user on a client computer to access files over a computer network much like local storage is accessed. However, usage of different shared libraries residing over the cloud by many users during the development and debugging stage is very inefficient and cost ineffective.

BRIEF DESCRIPTION OF THE DRAWINGS

The disclosure may be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3A illustrates example operations in a computer-implemented method for reducing the amount of data uploaded to and downloaded from a cloud computer in a cloud-enabled hardware simulation environment, in accordance with an embodiment of the present disclosure.

FIG. 3B illustrates example operations in a computer-implemented method for reducing the amount of data uploaded to and downloaded from a cloud computer in a cloud-enabled hardware simulation environment, in accordance with an embodiment of the present disclosure.

DETAILED DESCRIPTION

Figure 1:
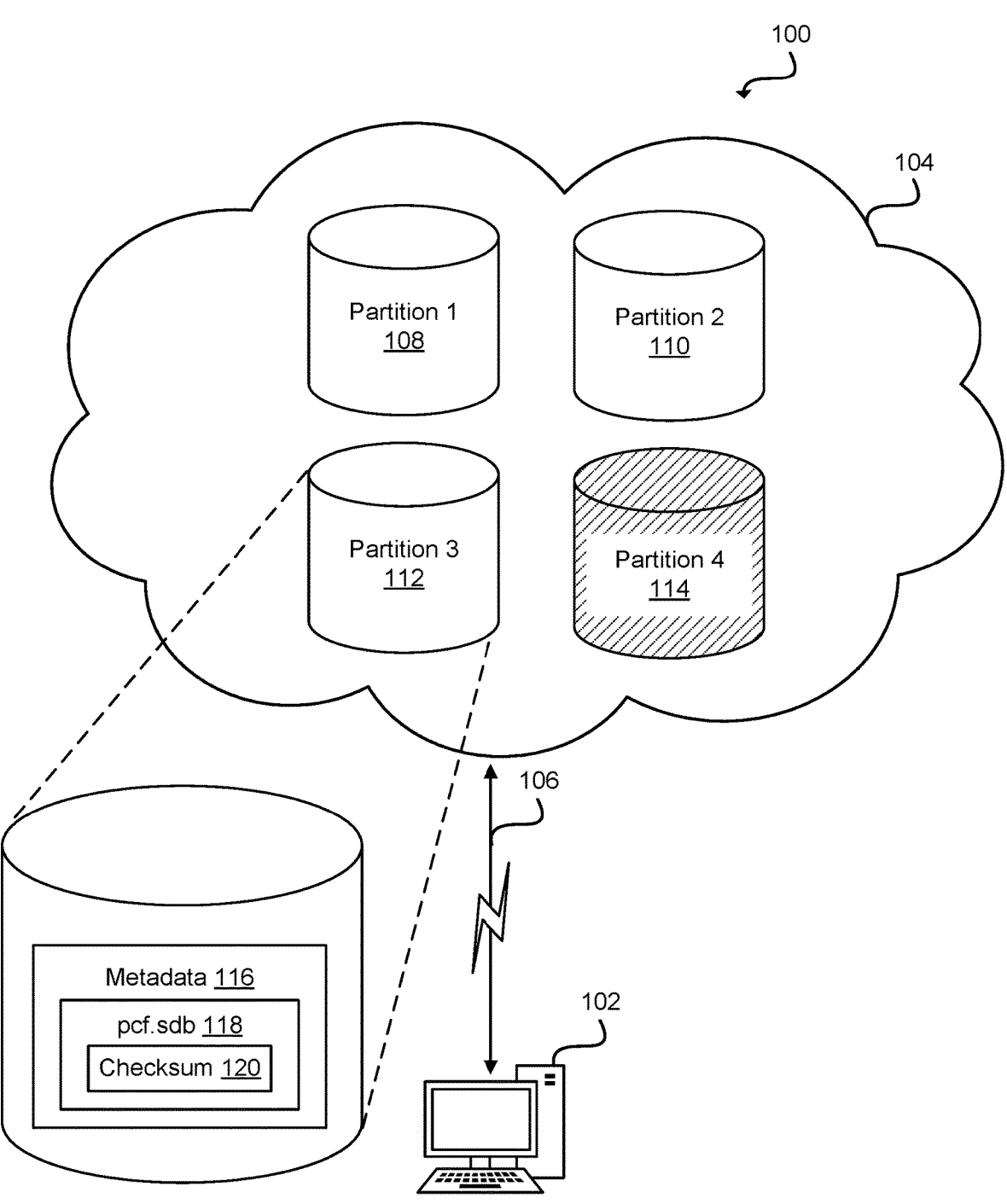
FIG. 1 illustrates an example system for reducing the amount of data uploaded to and downloaded from a cloud computer in a cloud-enabled hardware simulation environment, in accordance with an embodiment of the present disclosure.

Many users who perform simulation of electronic circuits (e.g., integrated circuits (ICs)) are using cloud space for storing various shared libraries. However, due to the way the current systems work, users are bound to download all the partitions (e.g., portions) of a shared library from a centralized cloud storage space to an end node (e.g., local computer). The decision whether a partition is reusable is then made locally by tools installed on the local computer by comparing the checksum of each partition with the checksum of the partition stored locally. A checksum is a digit representing the sum of the correct digits in a piece of stored or transmitted digital data, against which later comparisons can be made to detect changes in the data or errors in the data. If the checksum of the downloaded partition does not match with the checksum of the partition stored locally, then the partition has to be recompiled. This process wastes not only the data downloaded from the cloud but also the turnaround time (TAT) of compiling, and therefore increases disk memory footprint for a user.

Accordingly, the present disclosure relates to systems and methods for reducing the amount of data uploaded to and downloaded from a cloud server in a cloud-enabled hardware simulation environment. Initially, the cloud server receives a data file, such as a hardware description language (HDL) file, from a local computer that is connected to the cloud server via a wired or wireless network. The cloud server then divides the data file into several partitions based on a predefined criteria. In one embodiment, the number of partitions may be determined based on the size of the data file or the frequency of use of the data file, or other factors such as cross dependencies between the partitions and technology flows like gate level simulation (GLS), Synopsys® VCS® native low-power, Synopsys® VCS® Xprop, unified power format (UPF), etc. After dividing the data file into several partitions, the cloud server compiles the partitions associated with the data file to form respective compiled partitions. When the cloud server forms respective compiled partitions, it generates a status identifier (e.g., a checksum) for each of the compiled partitions. A checksum is a digit representing the sum of the correct digits in a piece of stored or transmitted digital data, against which later comparisons can be made to detect changes to the data or errors in the data. The checksum or the status identifier reflects a current version of the respective compiled partition. The cloud server then stitches or combines the compiled partitions to form an executable file (e.g., another HDL file), and stores the compiled partitions including the respective status identifiers in a storage area on the cloud server (e.g., non-transitory computer-readable medium). When a user or a local computer requests the same data file at a later point, the cloud server identifies the partitions associated with the requested file, and compares the status identifiers or checksums in the request with the status identifiers or checksums in the compiled partitions stored on the cloud server. The cloud server then identifies partitions having the same checksums as being reusable, and sends only the partitions that are identified as being reusable to the requesting local computer. The remaining compiled partitions are stored on the cloud for later use and may be purged or deleted if not used for a predetermined period of time.

Advantages of the present disclosure include, but are not limited to, efficient management of hardware description language (HDL) files in a cloud environment, resulting in faster build times, and elimination of redundancy seen in the current systems. The methods and systems disclosed enable downloading only the re-usable partitions, and enable uploading only those partitions that are newly compiled. It can also reduce disk memory footprint of each user. The methods and systems disclosed also enable downloading of reusable partitions and compiling new partitions simultaneously, which results in faster build time. Since only a portion of the metadata from the actual files is downloaded from the cloud, there is a significant amount of savings in terms of both compute power as well as the amount of disk space used by the HDL files on the cloud.

FIG. 1 is a block diagram of an example computing environment 100 for implementing a cloud-enabled hardware simulation system, according to some embodiments. It should be noted that other arrangements for computing environment 100 are possible. The computing environment 100 can include objects, such as one or more users and one or more computers 102. The computer 102 may be connected to a cloud server 104 via a wired or wireless networking 106 (e.g., the internet). The cloud server 104 may include private clouds, public clouds, hybrid clouds, and multi-clouds. The cloud server 104 may include one or more computing resources that provide Infrastructure-as-a-Service (IaaS), Platforms-as-a-Service (PaaS), Software-as-a-Service (SaaS), and other cloud computing services. Although a cloud server is used as an example, cloud server 104 may include other components such as cloud storage, databases, networking, and software.

Computer 102 may have installed on it one or more hardware simulation software such as an electronic design automation (EDA) tool that enables synthesis and design for testing, including an IC compiler, design compiler, physical compiler, test compiler, power compiler, field programmable gate arrays (FPGA) compiler, Tetramax, design ware products, or other compilers. Computer 102 may use one or more toolchains or programming tools that may be used to develop the IC design. The toolchains may be executed consecutively so the output or resulting environment of each tool becomes the input or starting environment for the next one. Alternatively or in addition, the toolchain may include a set of related tools that are not necessarily executed consecutively. The toolchain include a compiler and a linker (which transforms the source code into an executable program), libraries (which provide interfaces to the operating system), and a debugger (which is used to test and debug created programs).

Computer 102 may access a design of an electronic circuit (e.g., an IC), and generate a hardware description language (HDL) file. The design may be described in VHDL, Verilog, System Verilog Assertions (SVA), SystemC, MyHDL, Property Specification Language (PSL), Open Verilog Library (OVL), or any other hardware description language. Computer 102 then transmits the HDL file for storage on the cloud server 104. The cloud server 104 then divides the data file into several partitions 108, 110, 112, 114 based on a predefined criteria. In one embodiment, the number of partitions may be determined based on the size of the data file or the frequency of use of the data file, or other factors such as cross dependencies between the partitions and technology flows like gate level simulation (GLS), Synopsys® VCS® native low-power, Synopsys® VCS® Xprop, unified power format (UPF), etc. After dividing the data file into several partitions, the cloud server 104 compiles the partitions 108, 110, 112, 114 associated with the data file to form respective compiled partitions. Each compiled partition may include the data used to generate the combined IC design and metadata 116 associated with the partition. The metadata 116 may include a pcf.sdb file 118, which may include a checksum 120. Checksum 120 may include one or more digits representing the sum of the correct digits in a piece of stored or transmitted digital data, against which later comparisons can be made to detect changes to the data or errors in the data. The checksum 120 reflects a current version of the respective compiled partition. The checksums can be generated using a cyclic redundancy check algorithm, such as CRC-32, over intermediate representation of the HDL data. The cloud server 104 then stitches or combines the compiled partitions 108, 110, 112, 114 to form an executable file (e.g., a HDL file), and stores the compiled partitions 108, 110, 112, 114 including their respective checksums in a storage area on the cloud server 104. When computer 102 requests the same data file at a later point, the cloud server 104 identifies partitions 108, 110, 112, and 114 as being associated with the requested file, and compares the checksums in the request with the checksums in the compiled partitions stored on the cloud server 104. The cloud server 104 then identifies partitions 108, 110, 112 as having a matching checksum, and therefore as being reusable. Cloud server 104 then sends to the computer 102 only the partitions 108, 110, 112 that have a matching checksum and are identified as being reusable. However, partition 114 has a checksum that does not match the checksum in the request. Therefore, partition 114 may not be reusable since it has been modified, either by the same user or another user, and therefore has to be compiled locally and later uploaded to the cloud server 104.

In some embodiments, the cloud server 104 may receive a partition that may have been modified after combining the compiled partitions. The cloud server 104 may identify the modified partition as being new by comparing the checksum in the partition with a checksum in a version of the same partition stored on the cloud. In such instances, the cloud server 104 may compile the newly modified partition separately, and then stitch or combine the newly compiled partition with the rest of the compiled partitions to form a new executable file (e.g., HDL file). The cloud server 104 may then store the newly compiled partition and its metadata including the checksum in the same cloud storage area. Similarly, if the cloud server 104 receives newer partitions that were not originally stored on the cloud server, then the cloud server 104 may compile the newly generated partitions separately, and then stitch or combine the newly compiled partitions with the rest of the compiled partitions to form another executable file (e.g., HDL file). The cloud server 104 may then store the newly compiled partitions and the respective metadata including the checksum in the same cloud storage area. In some embodiments, both operations of sending the reusable partitions to a user, and receiving new or modified partitions from a user may be performed simultaneously, thereby saving bandwidth and disk storage space.

Figure 2:
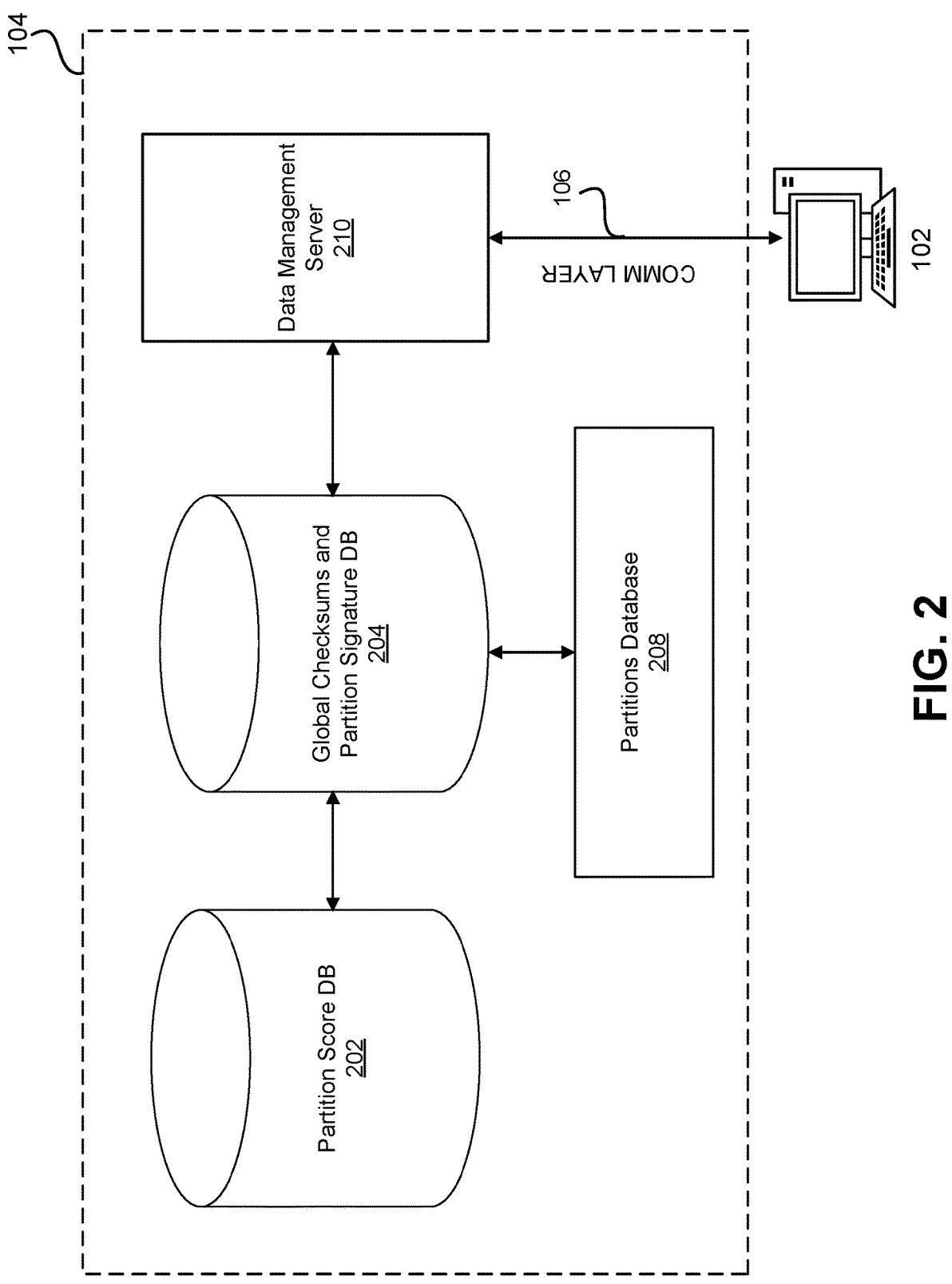
FIG. 2 illustrates example architecture of a cloud computer for reducing the amount of data uploaded to and downloaded from the cloud computer in a cloud-enabled hardware simulation environment, in accordance with an embodiment of the present disclosure.

FIG. 2 illustrates example architecture of a cloud server 104 for reducing the amount of data uploaded to and downloaded from the cloud computer in a cloud-enabled hardware simulation environment, in accordance with an embodiment of the present disclosure. Cloud server 104 may communicate with computer 102 via the communication layer or any other layer of the TCP/IP protocol. Cloud server 104 may include a data management server 210 that may receive one or more data files (e.g., the HDL files), either from computer 102 or any other computer, and organize the partitions associated with the data files according to their checksums. The data management server 210 may be in communication with a global checksums and partition signatures database 204. The global checksums and partition signatures database 204 may store the global checksums and partition signatures including links to the actual files. Additionally, the global checksums and partition signatures database 204 may maintain a mapping table that maps a specific checksum with a specific partition signature. For example, when the computer 102 requests a partition with a specific checksum, the data management server 210 can perform a lookup from the mapping table and identify a partition signature that specifically matches the requested checksum from the global checksums and partition signatures database 204. The actual files or partitions may be stored in the partitions database 208, which may be accessible from the global checksums and partition signatures database 204. The cloud server 104 may also include a partition score database 202 that may in communication with the global checksums and partition signatures database 204. The partition score database 202 may maintain a composite score for each compiled partition. The composite score may be based on one or more parameters including, but not limited to, the frequency of use of a partition, the size of a partition, or the time it was last used or generated. For example, a frequency score may be determined based on the frequency of use of a partition. Similarly, a freshness score may be determined based on the freshness of a partition, or when it was last modified. A size score may be determined based on the size of the partition. For example, a partition that is very large (10 GB or more) may have a low score and a partition that is small (1 GB or less) may have a high score, or vice versa. In one embodiment, the composite score may be based on a weighted average of the above three scores, and the weights may be determined by the user to optimize cloud storage. In some embodiments, when a composite score of a partition falls below a specific threshold, the partition database 208 may delete or purge such partitions from the database. The threshold score may be determined or adjusted by the user based on optimum cloud storage.

FIG. 3A depicts a flow diagram of example method 300 for reducing the amount of data uploaded to and downloaded from the cloud computer in a cloud-enabled hardware simulation environment, according to some implementations. Method 300 may be performed by one or more processing devices that may comprise hardware (e.g., circuitry, dedicated logic), software (such as is run on a general-purpose computer system or a dedicated machine), or a combination of both. Method 300 and each of its individual functions, routines, subroutines, or operations may be performed by one or more processors of the processing device executing the method. For example, the method 300 may be performed by the data management server 210 of FIG. 2. In certain implementations, method 300 may be performed by a single processing device. Alternatively, method 300 may be performed by two or more processing devices, each processing device executing one or more individual functions, routines, subroutines, or operations of the method.

At operation 302, the processing logic (e.g., of a processing device in the cloud server 104) receives a HDL file (e.g., a design of an IC or a portion thereof) for storage on a cloud server. At operation 304, the processing logic may divide the data file into several partitions (e.g., partitions 108, 110, 112, 114) based on a predefined criteria. In one embodiment, the number of partitions may be determined based on the size of the data file, the frequency of use of the data file, how recently the data file has been used, or other factors such as cross dependencies between the partitions and technology flows like gate level simulation (GLS), Synopsys® VCS® native low-power, Synopsys® VCS® Xprop, unified power format (UPF), etc.

At operation 306, the processing logic may compile the partitions associated with the data file to form respective compiled partitions. The processing logic may use an IC compiler, design compiler, physical compiler, test compiler, power compiler, field programmable gate arrays (FPGA) compiler, Tetramax, design ware products, or other compilers. At operation 308, the processing logic may generate status identifiers (e.g., checksums) that reflect a current version of the respective compiled partition. The checksums can be generated using a cyclic redundancy check algorithm, such as CRC-32, over intermediate representation of the HDL data. The compiled partitions may include the data used to generate the combined IC design and metadata associated with the partition. The metadata may include a pcf.sdb file, which may include the status identifier. At operation 310, the processing logic of the cloud server may stitch or combine the compiled partitions to form an executable file (e.g., a HDL file), and at operation 312, the processing logic may store the compiled partitions including their respective checksums in a storage area on the cloud server.

The processing logic may organize the partitions associated with the data files according to their status identifiers. In one embodiment, the processing logic may store the global checksums and partition signatures including links to the actual files in a database. The global checksums and partition signatures database may maintain a mapping table that maps a specific checksum with a specific partition signature. For example, when a user/computer requests a partition with a specific checksum, the processing logic can perform a lookup from the mapping table and identify a partition signature that specifically matches the requested checksum from the global checksums and partition signatures database. The actual files or partitions may be stored in the partitions database, which may be accessible from the global checksums and partition signatures database. The processing logic may also update a partition score database that may be in communication with the global checksums and partition signatures database. For example, the processing logic may maintain a composite score for each compiled partition. The composite score may be based on one or more parameters including, but not limited to, the frequency of use of a partition, the size of a partition, or the time it was last used or generated. For example, a frequency score may be determined based on the frequency of use of a partition. Similarly, a freshness score may be determined based on the freshness of a partition, or when it was last modified. A size score may be determined based on the size of the partition. For example, a partition that is very large (10 GB or more) may have a low score and a partition that is small (1 GB or less) may have a high score, or vice versa. In one embodiment, the composite score may be based on a weighted average of the above three scores, and the weights may be determined by the user to optimize cloud storage. In some embodiments, when a composite score of a partition falls below a specific threshold, the processing logic may delete or purge such partitions from the database. The threshold score may be determined or adjusted by the user based on optimum cloud storage.

FIG. 3B depicts a flow diagram of additional steps in a method 300 for reducing the amount of data uploaded to and downloaded from the cloud computer in a cloud-enabled hardware simulation environment, according to some implementations. At operation 314, the processing logic may receive a request for the data file (e.g., HDL file) from a local computer or any other source. At operation 316, the processing logic identifies partitions (e.g., partitions 108, 110, 112, and 114) as being associated with the requested data file (based on the earlier compilation in operation 306), and compares the checksums in the request with the checksums in the compiled partitions stored on the cloud server. At operation 318, the processing logic identifies that the checksums in the request match with the checksums in the compiled partitions stored on the cloud server. At operation 320, the processing logic identifies these partitions as having a matching checksum, and therefore as being reusable. At operation 322, the processing logic sends to the requesting computer only the partitions that have a matching checksum and are identified as being reusable. However, if a partition has a checksum that does not match the checksum in the request, the partition may not be reusable since it has been modified, either by the same user or another user, and therefore has to be compiled locally and later uploaded to the cloud server.

In some embodiments, the processing logic may receive a partition that may have been modified after combining the compiled partitions. The processing logic may identify the modified partition as being new by comparing the checksum in the partition with a checksum in a version of the same partition stored on the cloud. In such instances, the processing logic may compile the newly modified partition separately, and then stitch or combine the newly compiled partition with the rest of the compiled partitions to form a new executable file (e.g., HDL file). The processing logic may then store the newly compiled partition and its metadata including the checksum in the same cloud storage area. Similarly, if the processing logic receives newer partitions that were not originally stored on the cloud server, then the processing logic may compile the newly generated partitions separately, and then stitch or combine the newly compiled partitions with the rest of the compiled partitions to form another executable file (e.g., HDL file). The processing logic may then store the newly compiled partitions and the respective metadata including the checksum in the same cloud storage area. In some embodiments, both operations of sending the reusable partitions to a user, and receiving new or modified partitions from a user may be performed simultaneously, thereby saving bandwidth and disk storage space.

Figure 4:
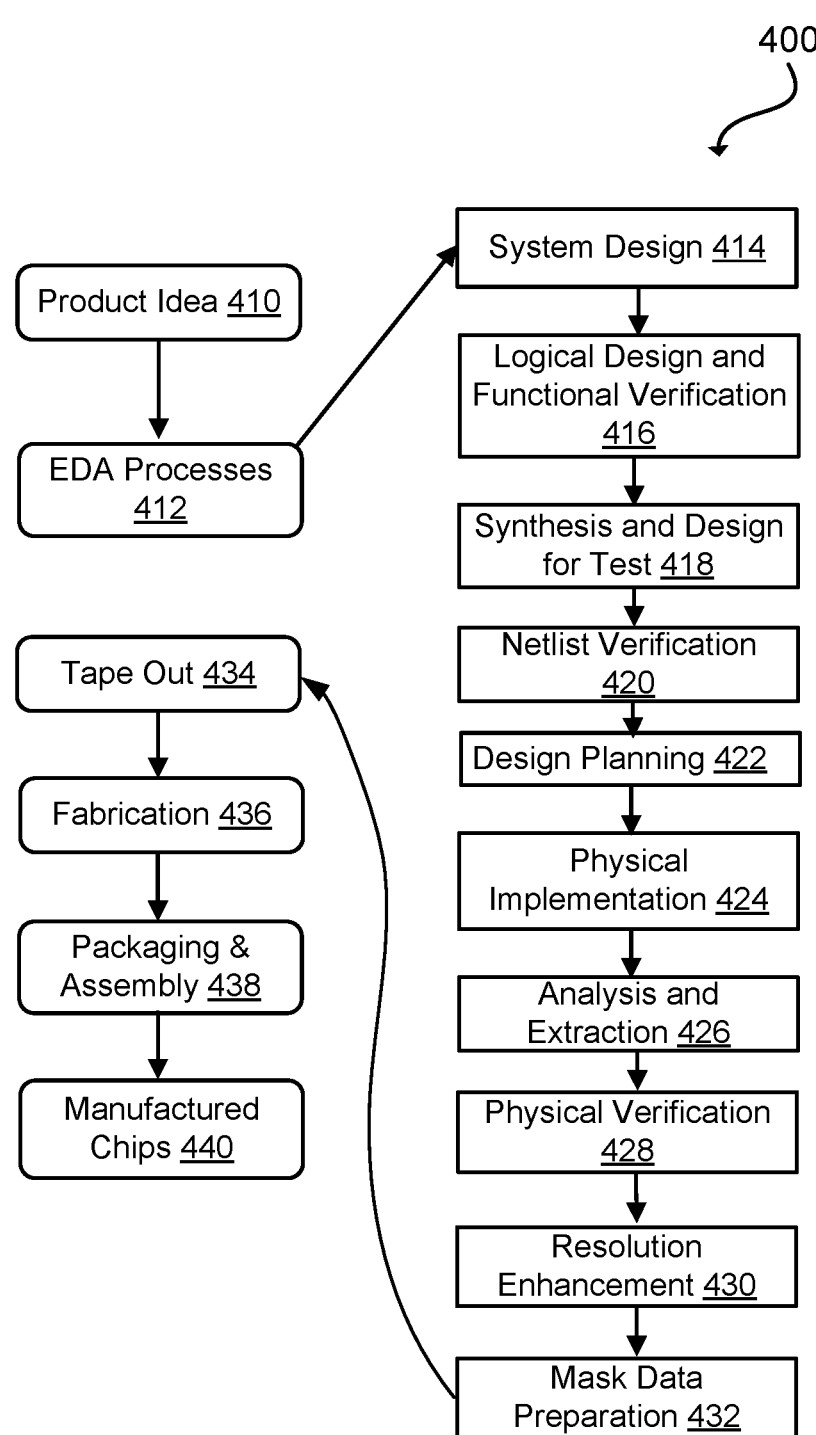
FIG. 4 depicts a flowchart of various processes used during the design and manufacture of an integrated circuit in accordance with some embodiments of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes can start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die can be fabricated 436 and packaging and assembly processes 438 can be performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which can be used for detailed descriptions of circuits with many analog components. Descriptions at each level of abstraction are enabled for use by the corresponding tools of that layer (e.g., a formal verification tool). A design process may use a sequence depicted in FIG. 4. The processes described herein can be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit can be specified in one or more description languages and the specification can be checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' can be used to speed up the functional verification.

During synthesis and design for test 418, HDL code can be transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist can be checked for compliance with timing constraints and for correspondence with the HDL code. During design planning 422, an overall floor plan for the integrated circuit can be constructed and analyzed for timing and top-level routing.

During layout or physical implementation 424, physical placement (positioning of circuit components such as transistors or capacitors) and routing (connection of the circuit components by multiple conductors) can occur, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and can be enabled as both physical structures and in simulations. Parameters can be specified for selected cells (based on 'standard cells') such as size and made accessible in a database for use by EDA products.

During analysis and extraction 426, the circuit function can be verified at the layout level, which permits refinement of the layout design. During physical verification 428, the layout design can be checked to ensure that manufacturing constraints are correct, such as DRC constraints, electrical constraints, lithographic constraints, and that circuitry function matches the HDL design specification. During resolution enhancement 430, the geometry of the layout can be transformed to improve how the circuit design is manufactured.

During tape-out, data can be created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
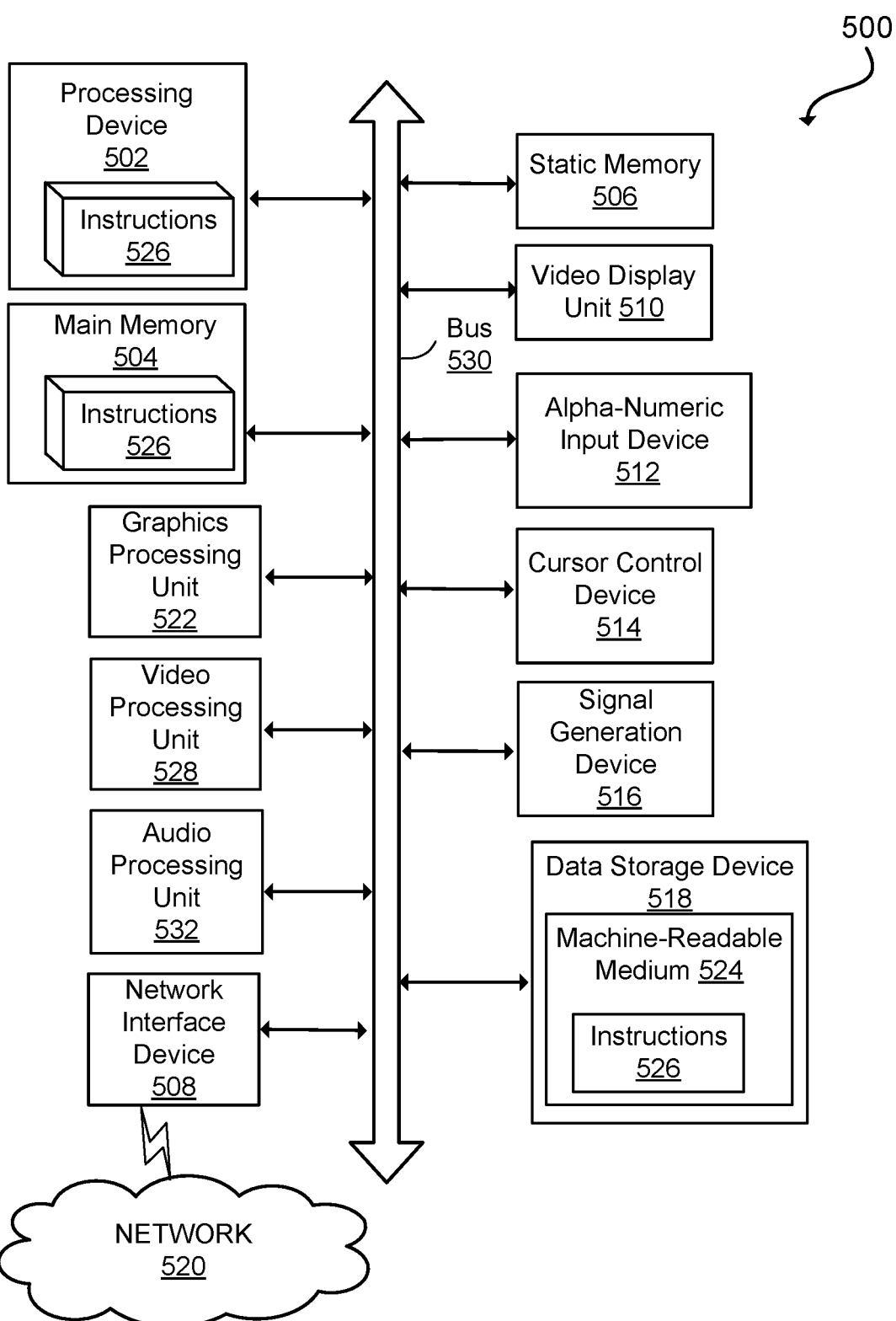
FIG. 5 depicts a diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In one embodiment, the non-transitory computer readable medium may include instructions 526 which when executed by a processing device (e.g., processing device 502), cause the processing device to generate a digital representation of a level-shifting circuit. The level-shifting circuit may include a level shifter configured to receive a first clock signal associated with a first power level (VDDP) and generate a second clock signal associated with a second power level (VDDA). The second power level may be greater than the first power level. The level-shifting circuit may further include an input clock buffer including a first input including the second clock signal from the level shifter, and a second input coupled in parallel to the first input; the second input including the first clock signal. In one embodiment, the first power level includes a peripheral voltage and the second power level includes a bitcell array voltage. The input clock buffer may be configured to generate an output clock signal when a difference between the second power level and the first power level is above a determined threshold voltage, and generate the output clock signal when the difference between the second power level and the first power level is below the determined threshold voltage. The output clock signal may be provided as inputs to a memory periphery and a memory timer, and the memory periphery and memory timer may be coupled in parallel to the input clock buffer.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It may be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It may be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
receiving, by a processing device, a data file;
dividing the data file into a plurality of partitions based on a defined criteria;
compiling the plurality of partitions associated with the data file to form a plurality of compiled partitions;
generating respective status identifiers for the plurality of compiled partitions, wherein the respective status identifiers reflect respective current versions of the plurality of partitions;
combining the plurality of compiled partitions to form a first executable file; and
storing the plurality of compiled partitions and the respective status identifiers in a first storage area of a first storage medium.

2. The method of claim 1, further comprising:
receiving a request for the data file;
identifying that one or more compiled partitions of the plurality of compiled partitions are reusable; and
sending the one or more compiled partitions identified as being reusable, wherein identifying that the one or more compiled partitions of the plurality of compiled partitions is reusable further comprises:
comparing, by the processing device, a first status identifier of one or more partitions in the request with a second status identifier in a version of the one or more compiled partitions stored in the first storage area; and
determining that the first status identifier is same as the second status identifier.

3. The method of claim 1, further comprising:
determining, by the processing device, that a first partition has been modified after combining the plurality of compiled partitions;
compiling the first partition to form a first compiled partition; and
combining the first compiled partition with the plurality of compiled partitions to form a second executable file.

4. The method of claim 3, wherein determining that the first partition has been modified further comprises:
comparing, by the processing device, a first status identifier in the first partition with a second status identifier in a version of the first compiled partition stored in the first storage area; and
determining that the first status identifier is different from the second status identifier.

5. The method of claim 3, further comprising:
storing, by the processing device, the first compiled partition and a respective status identifier for the first compiled partition in the first storage area of the first storage medium.

6. The method of claim 3, further comprising:
receiving, by the processing device, one or more second partitions after completion of the compiling;
identifying the one or more second partitions as new partitions;
compiling the one or more second partitions to form one or more second compiled partitions;

generating new status identifiers for the one or more second compiled partitions; and storing the one or more second compiled partitions and the new status identifiers in the first storage area.

7. The method of claim 1, further comprising:

determining, by the processing device, a frequency score for a first compiled partition of the plurality of compiled partitions, wherein the frequency score is based on a frequency of use of the first compiled partition in a determined time;

determining a freshness score for the first compiled partition, wherein the freshness score is based on time elapsed since a most recent use of the first compiled partition;

determining a size score for the first compiled partition, wherein the size score is based on an amount of storage area used by the first compiled partition; and determining a composite score based on a weighted average of the frequency score, the freshness score, and the size score.

8. The method of claim 7, further comprising:

responsive to determining that the composite score is outside of a determined threshold range, deleting, by the processing device, the first compiled partition from the first storage area of the first storage medium.

9. A non-transitory computer-readable medium storing program instructions executable by a processing device, causing the processing device to perform operations comprising:

receiving a hardware description language (HDL) data file comprising a design for a semiconductor device;

dividing the HDL data file into a plurality of partitions based on a defined criteria;

compiling the plurality of partitions associated with the HDL data file to form a plurality of compiled partitions;

generating respective status identifiers for the plurality of compiled partitions, wherein the respective status identifiers reflect respective current versions of the plurality of partitions;

stitching the plurality of compiled partitions to form a first executable file; and storing the plurality of compiled partitions and the respective status identifiers in a first storage area of a first storage medium.

10. The non-transitory computer-readable medium of claim 9, wherein the instructions further cause the processing device to perform operations comprising:

receiving a request for the HDL data file;

identifying that one or more compiled partitions of the plurality of compiled partitions is reusable; and sending the one or more compiled partitions identified as being reusable, wherein identifying that the one or more compiled partitions of the plurality of compiled partitions is reusable further comprises:

comparing a first status identifier of one or more partitions in the request with a second status identifier in a version of the one or more compiled partitions stored in the first storage area; and determining that the first status identifier is same as the second status identifier.

11. The non-transitory computer-readable medium of claim 9, wherein the instructions further cause the processing device to perform operations comprising:

determining that a first partition has been modified after combining the plurality of compiled partitions;

compiling the first partition to form a first compiled partition; and stitching the first compiled partition with the plurality of compiled partitions to form a second executable file.

12. The non-transitory computer-readable medium of claim 11, wherein determining that the first partition has been modified further comprises:

comparing a first status identifier in the first partition with a second status identifier in a version of the first compiled partition stored in the first storage area; and determining that the first status identifier is different from the second status identifier.

13. The non-transitory computer-readable medium of claim 11, wherein the instructions further cause the processing device to perform operations comprising:

storing the first compiled partition and a respective status identifier for the first compiled partition in the first storage area of the first storage medium.

14. The non-transitory computer-readable medium of claim 9, wherein the instructions further cause the processing device to perform operations comprising:

determining a frequency score for a first compiled partition of the plurality of compiled partitions, wherein the frequency score is based on a frequency of use of the first compiled partition in a determined time;

determining a freshness score for the first compiled partition, wherein the freshness score is based on time elapsed since a most recent use of the first compiled partition;

determining a size score for the first compiled partition, wherein the size score is based on an amount of storage area used by the first compiled partition; and determining a composite score based on a weighted average of the frequency score, the freshness score, and the size score.

15. The non-transitory computer-readable medium of claim 14, wherein the instructions further cause the processing device to perform operations comprising:

responsive to determining that the composite score is outside of a determined threshold range, deleting the first compiled partition from the first storage area of the first storage medium.

16. A method for reducing cloud storage space used by a hardware description language (HDL) data file, the method comprising:

receiving, by a processing device, the HDL data file comprising a design for a semiconductor device;

dividing the HDL data file into a plurality of partitions based on a defined criteria; compiling the plurality of partitions associated with the HDL data file to form a plurality of compiled partitions;

generating respective status identifiers for the plurality of compiled partitions, wherein the respective status identifiers reflect respective current versions of the plurality of partitions;

stitching the plurality of compiled partitions to form a first executable file; and storing the plurality of compiled partitions and the respective status identifiers in a first storage area of a first storage medium.

17. The method of claim 16, further comprising:

receiving, by the processing device, a request for the HDL data file;

comparing a first status identifier of one or more partitions in the request with a second status identifier in a version of one or more compiled partitions stored in the first storage area; and determining that the first status identifier is same as the second status identifier;

identifying that one or more compiled partitions of the plurality of compiled partitions is reusable; and sending the one or more compiled partitions identified as being reusable.

18. The method of claim 16, further comprising:

determining, by the processing device, a frequency score for a first compiled partition of the plurality of compiled partitions, wherein the frequency score is based on a frequency of use of the first compiled partition in a determined time;

determining a freshness score for the first compiled partition, wherein the freshness score is based on time elapsed since a most recent use of the first compiled partition;

determining a size score for the first compiled partition, wherein the size score is based on an amount of storage area used by the first compiled partition; and determining a composite score based on a weighted average of the frequency score, the freshness score, and the size score.

19. The method of claim 18, further comprising:

responsive to determining that the composite score is outside of a determined threshold range, deleting, by the processing device, the first compiled partition from the first storage area of the first storage medium.

20. The method of claim 16, further comprising:

receiving, by the processing device, one or more second partitions after completion of the compiling;

identifying the one or more second partitions as new partitions;

compiling the one or more second partitions to form one or more second compiled partitions:

generating new status identifiers for the one or more second compiled partitions; and storing the one or more second compiled partitions and the new status identifiers in the first storage area of the first storage medium.

* * * * *